United States Patent
Hsu et al.

(10) Patent No.: US 10,366,971 B2
(45) Date of Patent: Jul. 30, 2019

(54) PRE-APPLYING SUPPORTING MATERIALS BETWEEN BONDED PACKAGE COMPONENTS

(71) Applicant: Taiwan Semiconductor Manufacturing Company, Ltd., Hsin-Chu (TW)

(72) Inventors: Yu-Chen Hsu, Hsin-Chu (TW); Yu-Feng Chen, Hsin-Chu (TW); Han-Ping Pu, Taichung (TW); Meng-Tse Chen, Changzhi Township (TW); Guan-Yu Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 33 days.

(21) Appl. No.: 15/047,884

(22) Filed: Feb. 19, 2016

(65) Prior Publication Data
US 2016/0172348 A1 Jun. 16, 2016

Related U.S. Application Data

(62) Division of application No. 13/748,351, filed on Jan. 23, 2013, now Pat. No. 9,293,404.

(51) Int. Cl.
*H01L 21/56* (2006.01)
*H01L 25/00* (2006.01)
(Continued)

(52) U.S. Cl.
CPC ............ *H01L 25/50* (2013.01); *H01L 21/561* (2013.01); *H01L 21/565* (2013.01); *H01L 23/49816* (2013.01); *H01L 23/49833* (2013.01); *H01L 24/73* (2013.01); *H01L 24/97* (2013.01); *H01L 25/0655* (2013.01); *H01L 2224/13147* (2013.01); *H01L 2224/13644* (2013.01); *H01L 2224/13655* (2013.01); *H01L 2224/13664* (2013.01); *H01L 2224/14135* (2013.01); *H01L 2224/16225* (2013.01); *H01L 2224/2732* (2013.01); *H01L 2224/27334* (2013.01);
(Continued)

(58) Field of Classification Search
CPC ......... H01L 23/49816; H01L 23/49833; H01L 24/73; H01L 24/97; H01L 21/561; H01L 21/565; H01L 2224/73104; H01L 2224/14135
See application file for complete search history.

(56) References Cited

U.S. PATENT DOCUMENTS 6,458,609 B1 * 10/2002 Hikita ..................... G01P 3/488
257/E21.503
7,135,765 B2 * 11/2006 Venkateswaran ... H01L 21/4853
257/698
(Continued)

FOREIGN PATENT DOCUMENTS

TW  I282153  6/2007
TW  M462948 U  10/2013

*Primary Examiner* — Ahmed N Sefer
(74) *Attorney, Agent, or Firm* — Slater Matsil, LLP

(57) ABSTRACT

A structure includes a first package component, and a second package component over and bonded to the first package component. A supporting material is disposed in a gap between the first package component and the second package component. A molding material is disposed in the gap and encircling the supporting material.

20 Claims, 9 Drawing Sheets

(51) Int. Cl.
  *H01L 23/00* (2006.01)
  *H01L 23/498* (2006.01)
  *H01L 25/065* (2006.01)

(52) U.S. Cl.
  CPC .............. *H01L 2224/29013* (2013.01); *H01L 2224/2919* (2013.01); *H01L 2224/32225* (2013.01); *H01L 2224/73103* (2013.01); *H01L 2224/73104* (2013.01); *H01L 2224/73203* (2013.01); *H01L 2224/73204* (2013.01); *H01L 2224/81191* (2013.01); *H01L 2224/83191* (2013.01); *H01L 2224/97* (2013.01); *H01L 2924/01322* (2013.01); *H01L 2924/3511* (2013.01)

(56) References Cited

U.S. PATENT DOCUMENTS

| | | |
|---|---|---|
| 7,902,666 B1 | 3/2011 | Hsu et al. |
| 2005/0001331 A1 | 1/2005 | Kojima et al. |
| 2005/0003587 A1* | 1/2005 | Shiozawa ............. H01L 25/105 438/126 |
| 2006/0003569 A1* | 1/2006 | Farnworth ............ H01L 23/293 438/613 |
| 2008/0017982 A1* | 1/2008 | Nakatani ................ H01L 24/11 257/737 |
| 2008/0171402 A1 | 7/2008 | Karnezos |
| 2009/0039491 A1* | 2/2009 | Kim ..................... H01L 21/561 257/686 |
| 2010/0320619 A1* | 12/2010 | Ko ........................ H01L 23/481 257/777 |
| 2011/0133327 A1 | 6/2011 | Hsu et al. |
| 2011/0171780 A1 | 7/2011 | Kado et al. |
| 2012/0074586 A1* | 3/2012 | Seo ........................ H01L 25/16 257/774 |
| 2012/0280404 A1 | 11/2012 | Kwon et al. |
| 2013/0056872 A1* | 3/2013 | Liu ......................... H01L 23/48 257/738 |
| 2013/0147041 A1* | 6/2013 | Chan ...................... H01L 21/48 257/738 |
| 2013/0214431 A1 | 8/2013 | Lin et al. |
| 2013/0217188 A1* | 8/2013 | Wang .................... H01L 21/563 438/118 |
| 2013/0221506 A1* | 8/2013 | Zhao ..................... H01L 23/367 257/676 |
| 2013/0292818 A1 | 11/2013 | Jo |
| 2014/0015126 A1 | 1/2014 | Yang |
| 2014/0054760 A1* | 2/2014 | Yu .......................... H01L 23/34 257/692 |
| 2014/0061946 A1* | 3/2014 | Zhao ...................... H01L 24/17 257/774 |
| 2014/0084487 A1* | 3/2014 | Zhao ..................... H01L 25/105 257/777 |
| 2014/0185264 A1* | 7/2014 | Chen ................... H01L 23/3128 361/814 |

* cited by examiner

PRE-APPLYING SUPPORTING MATERIALS BETWEEN BONDED PACKAGE COMPONENTS

PRIORITY CLAIM AND CROSS-REFERENCE

This application is a divisional of U.S. patent application Ser. No. 13/748,351, entitled "Pre-Applying Supporting Materials between Bonded Package Components," filed on Jan. 23, 2013, which application is incorporated herein by reference.

BACKGROUND

In the integrate circuit packaging art, a device die may be bonded to a package substrate. Typically, in the packaging of device dies, a plurality of device dies is bonded to a plurality of package substrates, which are included in a package substrate strip. After reflowing, the package substrates and the device dies are bonded to each other through solder regions.

A molding underfill is then molded on the device dies. The molding underfill may be disposed to the spaces between the device dies and the package substrates. The molding may be performed at package substrate strip level, wherein a plurality of device dies is molded simultaneously.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package and the method of forming the same are provided in accordance with various exemplary embodiments. The intermediate stages of forming the package are illustrated. The variations and the operation of the embodiments are discussed. Throughout the various views and illustrative embodiments, like reference numbers are used to designate like elements.

Figure 1A:
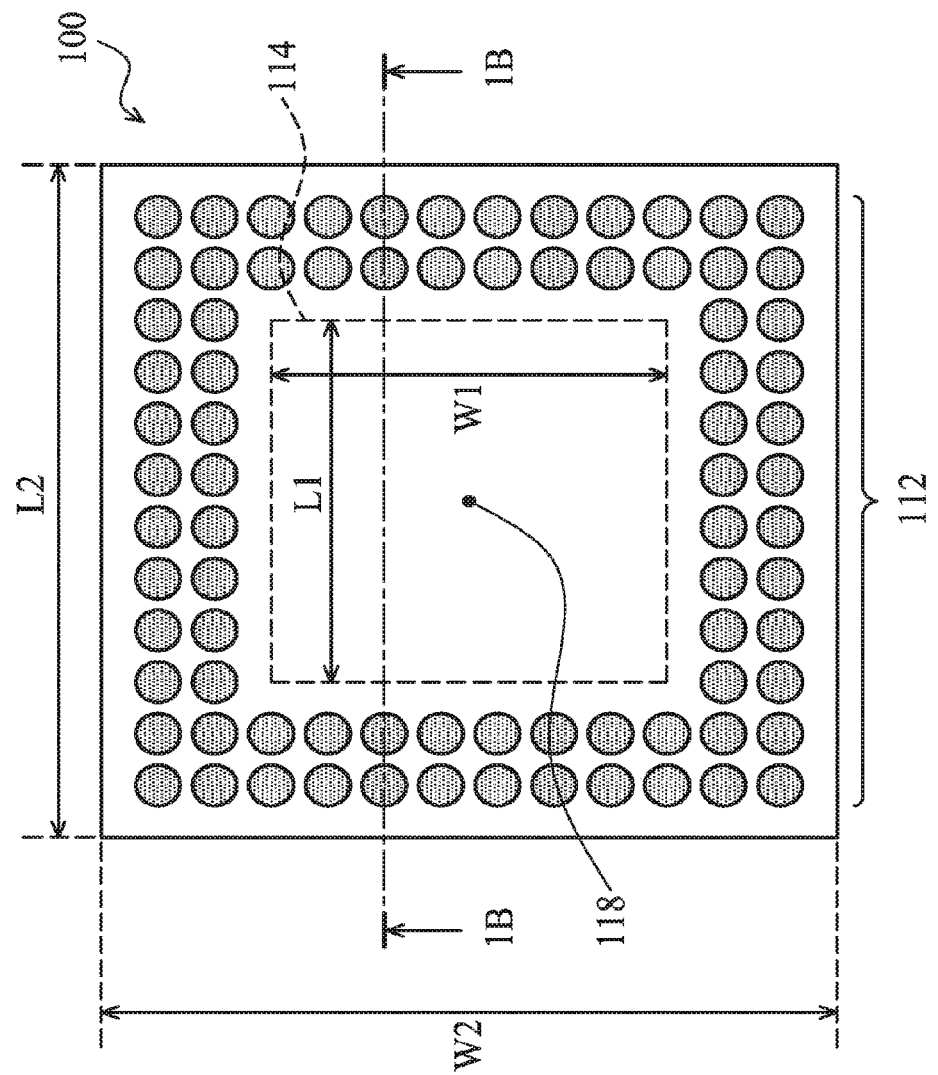
FIGS. 1A through 5 are top views, bottom views, and cross-sectional views of intermediate stages in the manufacturing of a package in accordance with some exemplary embodiments.
Figure 1B:
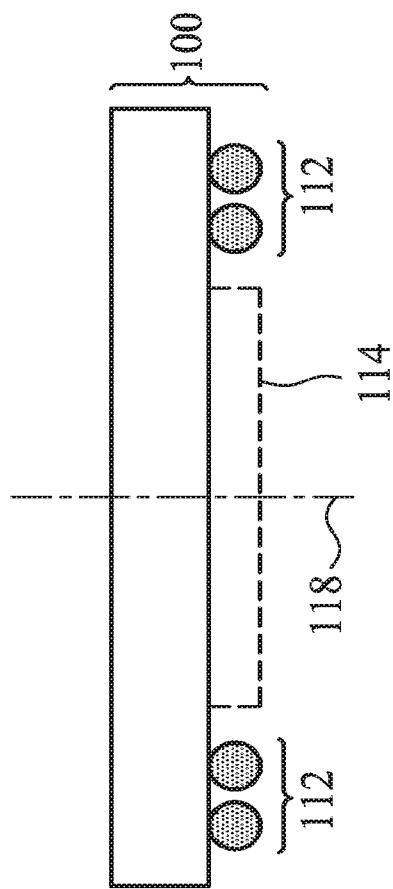

FIGS. 1A and 1B illustrate a bottom view and a cross-sectional view, respectively, of a package component in accordance with some exemplary embodiments. The cross-sectional view shown in FIG. 1B is obtained from the plane crossing line 1B-1B in FIG. 1A. Package component 100 may be a device die that includes active devices such as transistors (not shown) therein, although package component 100 may also be other type of package components. For example, package component 100 may be a package that includes an interposer (which does not include active devices therein), and a device die bonded to the interposer. The interposer may, or may not, include passive devices such as resistors, capacitors, inductors, and/or the like, formed therein. Package component 100 includes a plurality of connectors 112 on a side of package component 100. Throughout the description, the side of package component 100 having connectors 112 thereon is referred to as a bottom side. In some embodiments, connectors 112 include metal pillars such as copper pillars, wherein solder caps may be, or may not be, formed on the metal pillars. In alternative embodiments, connectors 112 include solder balls. The metal pillars in connectors 112 may be formed of copper or a copper alloy, and may also include additional layers (not shown) such as a nickel layer, a palladium layer, a gold layer, or the like.

Connectors 112 are disposed in the peripheral region of package component 100. In some embodiments, package component 100 includes four sides, and connectors 112 are disposed adjacent to the four sides of package component 100. A center region, which is marked as region 114, of the bottom side of package component 100 is free from connectors 112 formed therein. Center regions 114 may have any top-view shape. For example, in some embodiments, as shown in FIG. 1A, center region 114 has a rectangular shape, which may also be square. In alternative embodiments (not shown), center region 114 has a top-view shape of a circle, a hexagon, or the like. Center region 114 may include the center 118 of package component 100 and the surrounding regions. In some embodiments, the dimensions of center region 114, which includes length L1 and width W1, are greater than about 50 percent, or greater than about 50 percent, the respective length L2 and width W2 of package component 100. FIG. 1B illustrates a cross-sectional view of package component 100, wherein center region 114 is illustrated. It is observed that although FIG. 1A shows that center region 114 is a continuous region without being separated by connectors 112. In alternative embodiments, center region 114 may be separated into two, three, four, or more sub regions, with connectors 112 formed between the sub regions.

Figure 2A:
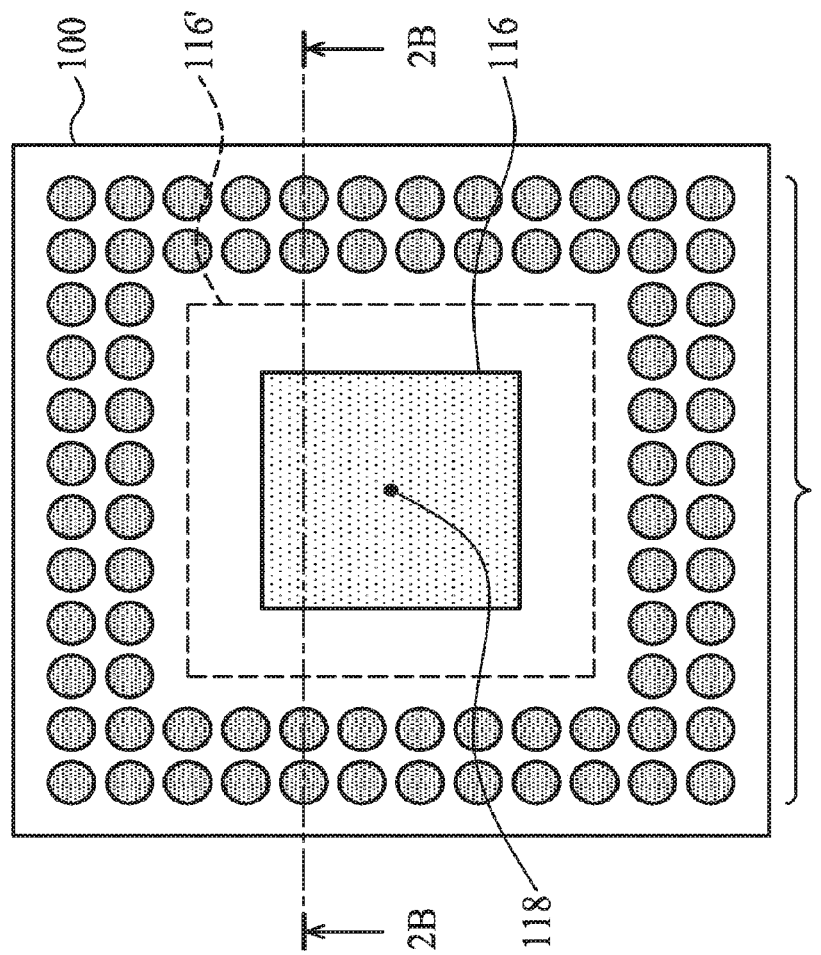
Figure 2B:
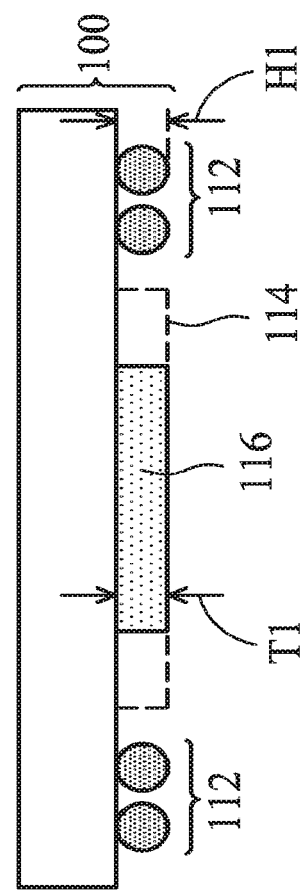

FIGS. 2A and 2B illustrate a bottom view and a cross-sectional view, respectively, referring to FIG. 2A, supporting material 116 is disposed on the bottom side of package component 100, and in center region 114. Furthermore, the center 118 may be filled with supporting material 116. Supporting material 116 may be a dielectric material such as a Die-Attach Film (DAF) or a Non-Conductive Film (NCF), which is an adhesive that may be used to attach dies to other package components. Supporting material 116 may include an organic material such as a polymer, a resin, an epoxy, and/or the like. In alternative embodiments, supporting material 116 comprises molding underfill. Supporting material 116 may also be a non-organic material. Supporting material 116, when applied on the bottom surface of package component 100, may be in the form of a paste in accordance with some embodiments, and may be applied, for example, using stencil printing or another applicable method. In some embodiments, as shown in FIG. 2A, supporting material 116 is separated from, and not in contact with, any of connectors 112. In alternative embodiments, supporting material 116 may be filled between some neighboring connectors 112, and may also be in contact with, and encircle, some of connectors 112. In alternative embodiments, supporting material 116 is a solid material, which is pre-cut to a suitable size, and adhered to the bottom surface of package component. The thickness of supporting material 116 is uniform throughout the entirety of supporting material 116.

Supporting material 116, when applied as a paste (a liquid with a high viscosity), may be fully or partially cured. In the embodiments wherein supporting material 116 is a solid material at the time it is adhered, supporting material 116 may be a dielectric plate, although it may also be a semiconductor plate or a conductive plate in accordance with alternative embodiments.

Figure 4A:
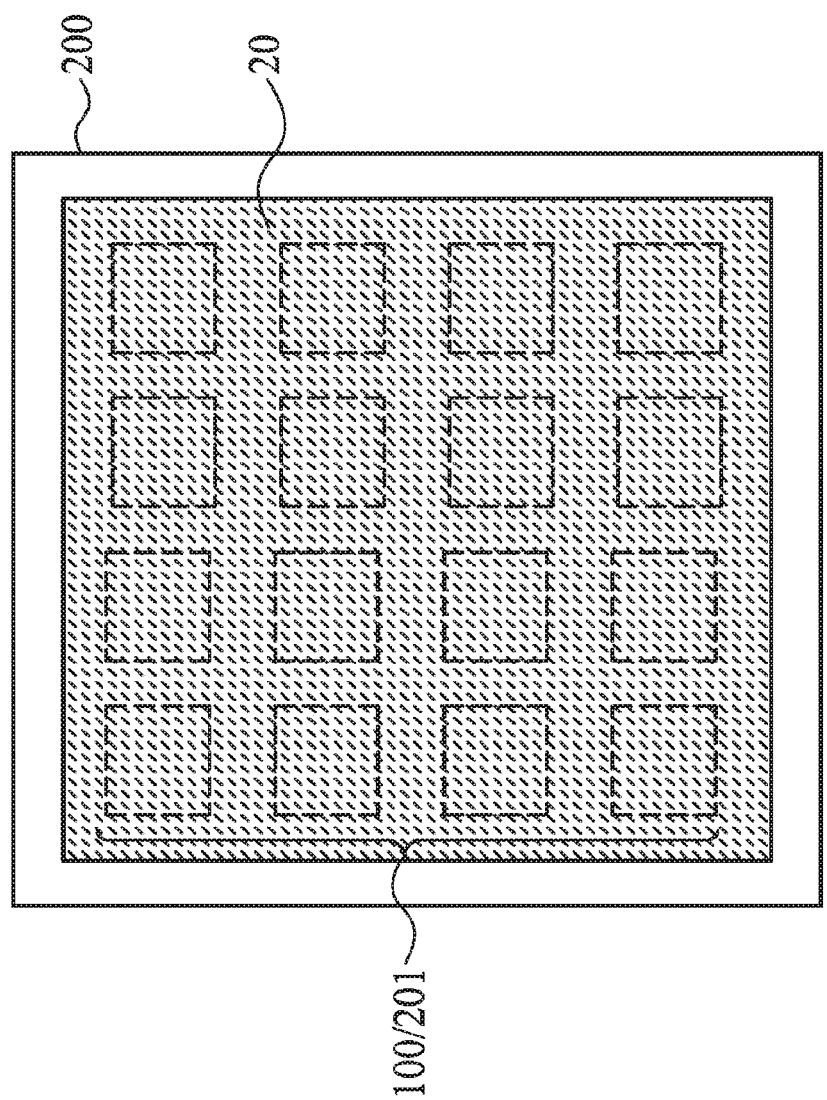
Figure 4B:
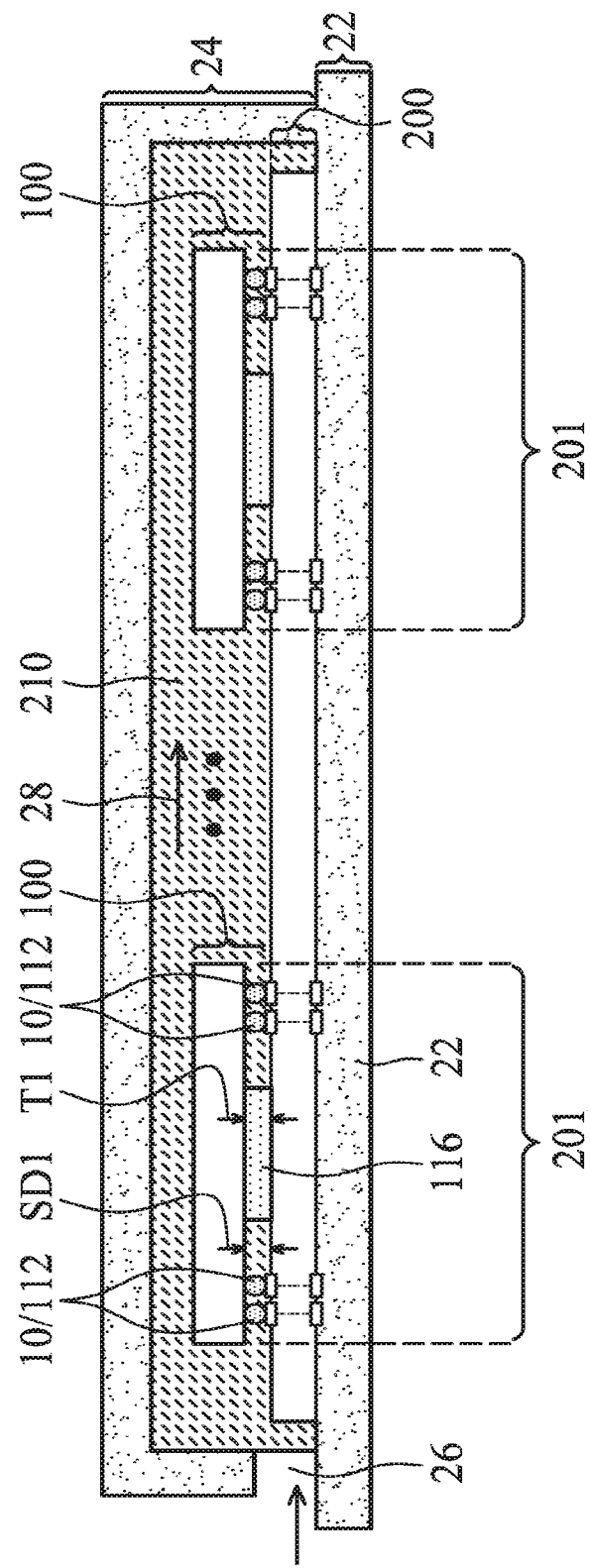

The bottom-view area of supporting material 116 may be greater than about 20 percent the bottom-view area of package component 100. Experiment results indicate that supporting material 116 having such an area is adequate for supporting package component 100, and resisting the deflection of package component 100 in the subsequent molding process, as shown in FIGS. 4A and 4B. When the area of supporting material 116 is smaller, the supporting force may not be enough, a deflection may occur. The bottom-view area of supporting material 116 may also be greater than about 40 percent or 50 percent the bottom-view area of package component 100 to improve the supporting ability of supporting material 116. In addition, the bottom-view area of supporting material 116 may be between about 20 percent and about 80 percent the bottom area of center region 114, which is free from connectors 112 therein.

In some embodiments, as shown in FIG. 2A, supporting material 116 forms a continuous region, and there is a single piece of supporting material 116 adhered to package component 100. In alternative embodiments, supporting material 116 may include several discrete pieces spaced apart from each other. In these embodiments, there may be, or may not be, connectors 112 located between the discrete pieces of supporting material 116.

FIG. 2B illustrates the cross-sectional view of package component 100 and supporting material 116, wherein the cross-sectional view is obtained from the plane crossing line 2B-2B in FIG. 2A. In some embodiments, thickness T1 of supporting material 116 is controlled, so that it is substantially equal to the standoff distance SD1 (FIG. 4B) after package component 100 is bonded to package component 200. In some embodiments, thickness T1 is smaller than height H1 of connectors 112. In other embodiments, thickness T1 is substantially equal to or greater than height H1 of connectors 112.

Figure 3A:
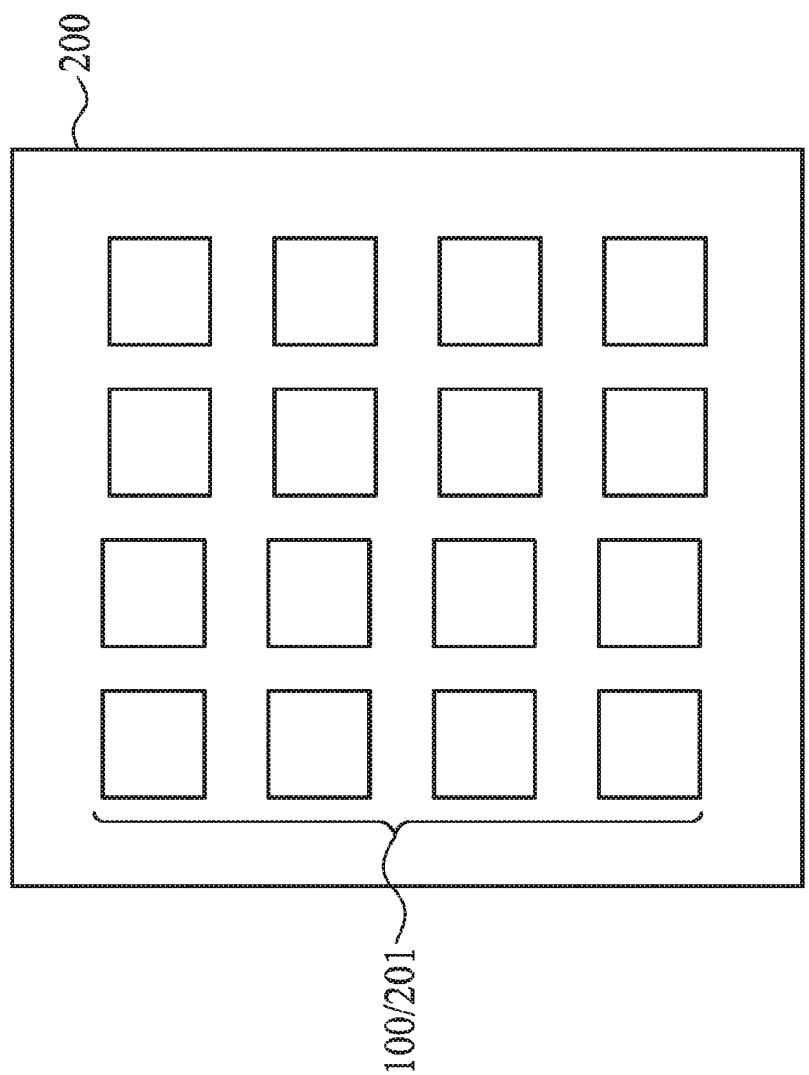
Figure 3B:
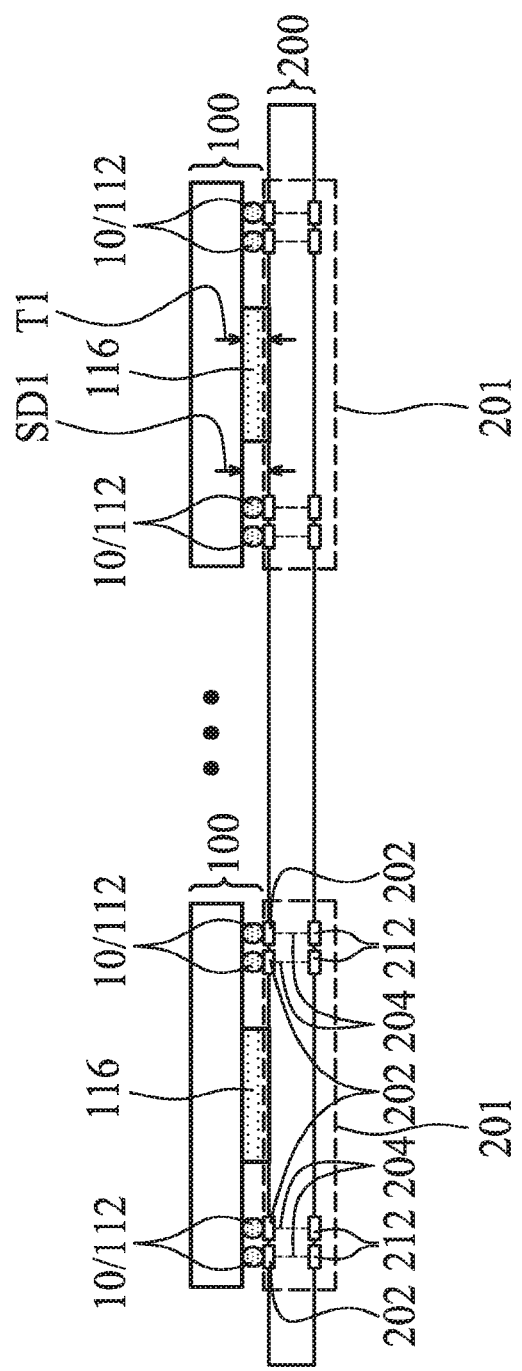

Next, referring to FIGS. 3A and 3B, a plurality of package components 100, which may be identical to each other, is bonded to package component 200. Package component 200 may be a package substrate strip in accordance with some embodiments, which includes a plurality of package substrates 201 therein. Package component 200 may have a rectangular top-view shape. Alternatively, package component 200 may comprise another type of package components such as interposers, for example. Accordingly, Package component 200 may have a shape of a wafer, which has a circular shape. Package component 200 may include bond pads (or other types of connectors) 202 and 212 (FIG. 3B) on opposite sides of package component 200. Redistribution lines 204 in package component 200 interconnect connectors 202 and the respective connectors 212. Package component 200 may be a built-up substrate strip, which may include a core and layers formed on opposite sides of the core. Alternatively, package component 200 is a laminate substrate strip. In yet other embodiments, package component 200 may be a printed circuit board (PCB).

Referring to FIG. 3B, package components 100 and 201 may be bonded to each other through the reflow of solder regions 10, which may comprise a lead-free solder, a eutectic solder, or the like. Solder regions 10 may include the pre-solder regions (if any) that were parts of connectors 112 on package component 100. In some embodiments, connectors 112 include non-reflowable regions such as copper pillars, and hence connectors 112 are also marked. During the bonding process, a pressure may be applied on package components 100, so that the bottom surface of supporting material 116 contacts the top surface of package component 200. As a result, standoff SD1 of package component 100 is equal to thickness T1 of supporting material 116, wherein standoff SD1 is the distance between the bottom surface of package component 100 (not including connectors 112) and the top surface of package component 200/201. Accordingly, by adjusting thickness T1 of supporting material 116, standoff SD1 may be adjusted to an appropriate value. As a result, the likely crushing of connectors 10/112, which may cause the bridging of connectors 10/112, is prevented, and connectors 10/112 may be formed closer to each other without the concern of bridging.

Referring to FIGS. 4A and 4B, after the bonding of package components 100 and 200, a molding material 210 is used to mold package components 100 therein. Molding material 210 is also filled into the gaps between package components 100 and the underlying package component 200, as shown in FIG. 4B. Molding material 210 may be a molding underfill, although other molding materials may be used. In some embodiments of the molding process, as shown in FIG. 4B, package component 200 is placed on bottom mold 22. Upper mold 24 is then used to cover package components 100 and 200, so that package components 100 and 200 are disposed in the space enclosed by upper mold 24 and bottom mold 22. Molding material 210 is then injected into the space through opening 26, which opening 26 may either be in upper mold 24 or in bottom mold 22. Molding material 210 flows in the direction illustrated by arrow 28, and is filled into the spaces over package components 200, the gaps between package components 100 and 200, and the gaps between connectors 112 and solder regions 10. During the molding process, since supporting material 116 occupies the center regions 114 (FIGS. 1A and 1B) that are between package components 100 and 200, it is unlikely to have large voids formed.

If, however, supporting material 116 is not formed, since the portion of molding material 210 flows faster in the regions over package components 100 than in the gaps between package components 100 and 200, before molding material 210 fills a gap, molding material 210 has passed the corresponding package component 100 from above, and hence a large void may be formed in center regions 114 (FIG. 1A). During the respective molding process, the pressure applied on the top surfaces and the bottom surfaces of a package component 100 would have been unbalanced (different from each other). This may cause the deflection (warpage) of the respective package components 100. By adding supporting material 116 before the molding process is performed, supporting material 116 may act as a support when a pressure is applied to the top surface of package components 100, wherein the pressure is caused by the unbalanced forces occurring on the top surfaces and the bottom surfaces of package components 100.

After the injection of molding material 210, molding material 210 is cured. Voids may or may not be formed in molding material 210. Furthermore, with the formation of supporting material 116, even if voids are formed in molding material 210, due to the existence of supporting material 116, the voids will be smaller than if supporting material 116 is not formed.

Figure 5:
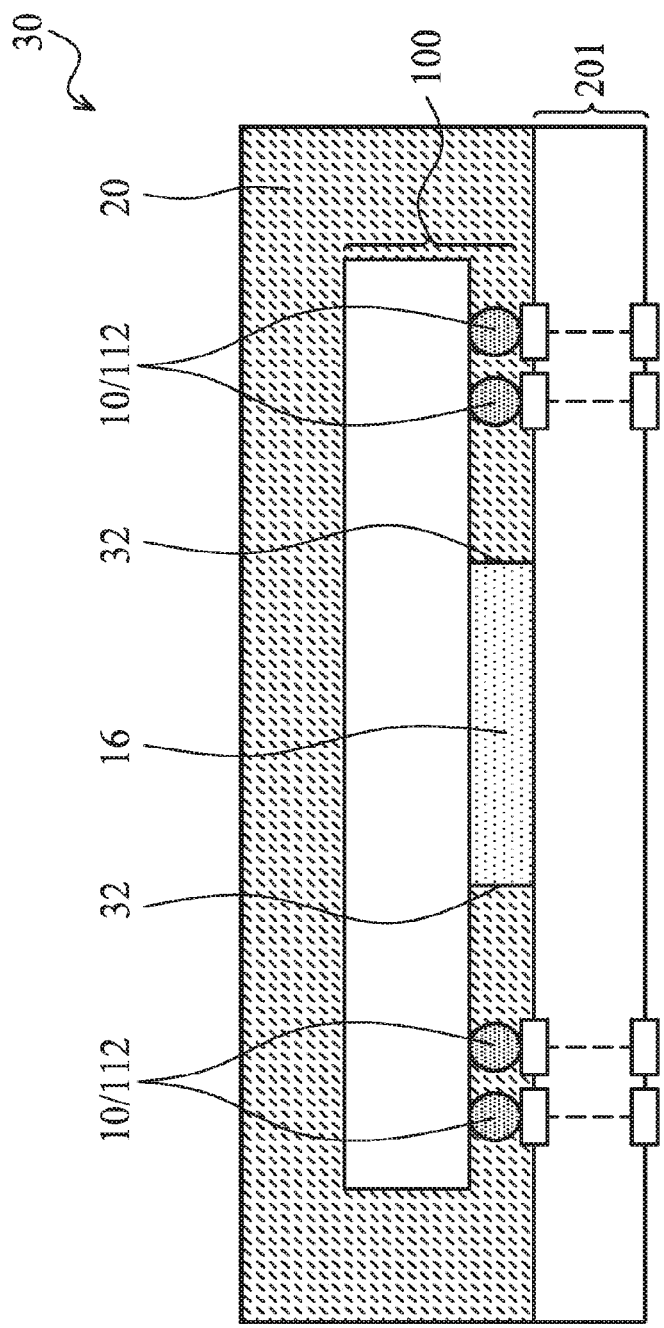

After the molding process, molds 22 and 24 are removed, and the bonded package components 100 and 200 are sawed apart to form a plurality of packages 30. FIG. 5 illustrates one of packages 30. Package 30 includes package component 100 and package component 201 bonded to each other.

In package 30, supporting material 116 is disposed in the gap between package components 100 and 201, and may occupy the center region of the gap. Molding material 210 may encircle, and in contact with, supporting material 116. In some embodiments, supporting material 116 and molding material 210 comprise different materials. In alternative embodiments, supporting material 116 and molding material 210 are formed of a same material. In these embodiments, however, interfaces 32 may still be observed between supporting material 116 and molding material 210 since supporting material 116 and molding material 210 are cured in different curing processes.

In accordance with embodiments, a structure includes a first package component, and a second package component over and bonded to the first package component. A supporting material is disposed in a gap between the first package component and the second package component. A molding material is disposed in the gap and encircling the supporting material. No electrical connector that is connected to the first package component and the second package component penetrates through the supporting material.

In accordance with other embodiments, a structure includes a first package component, a second package component over and bonded to the first package component through a plurality of electrical connectors disposed adjacent to peripheral regions of the second package component. A center region of a gap between the first package component and the second package component is free from electrical connectors therein. A supporting material is disposed in the gap and surrounded by the plurality of electrical connectors. A molding material is disposed in the gap and contacting the supporting material.

In accordance with yet other embodiments, a method includes disposing a supporting material to a surface of a first package component, wherein the first package component includes a plurality of electrical connectors on the surface and adjacent to peripheral regions of the first package component. The supporting material is adjacent to a center region of the surface. After the step of disposing, the first package component is bonded to a second package component through the plurality of electrical connectors, with the supporting material disposed between the first package component and the second package component. A molding process is then performed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    disposing a supporting material onto a surface of a first package component, wherein the first package component comprises a plurality of electrical connectors on the surface, wherein the plurality of electrical connectors is adjacent to peripheral regions of the first package component, and wherein the supporting material is adjacent to a center region of the surface;
    after the supporting material is disposed, bonding the first package component to a second package component through the plurality of electrical connectors, wherein the supporting material has a first surface in contact with the first package component, and a second surface in contact with the second package component, and the first surface and the second surface are opposite to each other; and
    after the bonding encapsulating the supporting material and the plurality of electrical connectors in an encapsulating material, wherein the supporting material and the encapsulating material are different from each other, the supporting material has a sidewall surface different from the first and second surfaces, the encapsulating material is in contact with at least a portion of the sidewall surface, and a portion of the encapsulating material is between the sidewall surface and one of the plurality of electrical connectors.

2. The method of claim 1, wherein the disposing the supporting material comprises:
    disposing the supporting material as a paste; and
    at least partially curing the paste.

3. The method of claim 2, wherein the paste is partially cured when the encapsulating material is encapsulated.

4. The method of claim 2, wherein the paste is fully cured before the supporting material is encapsulated by the encapsulating material.

5. The method of claim 1, wherein the disposing the supporting material comprises adhering a solid material to the surface of the first package component.

6. The method of claim 5, wherein the solid material comprises a semiconductor material.

7. The method of claim 1, wherein after the bonding, the supporting material is isolated from the plurality of electrical connectors by the encapsulating material.

8. The method of claim 1, the encapsulating material contacting the first package component and the second package component.

9. A method comprising:
    forming a plurality of package components, wherein the forming each of the plurality of package components comprises:
        disposing a supporting material to a surface of a first package component, wherein the supporting material is adjacent to a center region of the surface, wherein the disposing the supporting material comprises:
            disposing the supporting material as a paste; and
            curing the paste;
    after the paste is cured, bonding the plurality of package components to a second package component, with the plurality of package components arranged as an array, wherein each of the plurality of package components is bonded to the second package component through a plurality of electrical connectors, and the supporting material has a surface in contact with the second package component; and
    after the bonding, encapsulating the plurality of package components in an encapsulating material, the encapsulating material contacting a first sidewall surface and a second sidewall surface of the supporting material, and a distance between the first sidewall surface and the second sidewall surface being less than a length of the first package component.

10. The method of claim 9 further comprising sawing the second package component and the encapsulating material to form a plurality of packages.

11. The method of claim 9, wherein the supporting material defines a standoff distance between the first package component and the second package component.

12. The method of claim 9, wherein the encapsulating material encircles each of the plurality of electrical connectors and the supporting material.

13. The method of claim 9, the encapsulating material contacting the plurality of package components and the second package component.

14. A method comprising:
 disposing a paste onto, and in contact with, a surface of a device die;
 curing the paste to form a supporting material, wherein the supporting material has a first planar surface facing the device die, and the device die comprises a plurality of solder regions surrounding the supporting material;
 bonding the device die to a package substrate through the plurality of solder regions, with a second surface of the supporting material contacting the package substrate, and the first planar surface and the second surface are opposite to each other, wherein the plurality of solder regions are reflowed to join the device die to the package substrate, and a thickness of the supporting material is substantially equal to or greater than a height of the plurality of solder regions; and
 filling a molding compound into a gap between the device die and the package substrate, wherein the molding compound and the supporting material are different materials, and a portion of the molding compound is between two of the plurality of solder regions.

15. The method of claim 14, wherein the disposing the paste comprises printing.

16. The method of claim 15, wherein the paste is fully cured when the molding compound is filled into the gap.

17. The method of claim 14, wherein the molding compound comprises a portion overlapping the device die.

18. The method of claim 14, wherein no solder region that is between the package substrate and the device die penetrates through the supporting material.

19. The method of claim 14, wherein the molding compound is further molde over the device die.

20. The method of claim 14, the molding compound contacting the device die and the package substrate.

* * * * *